(12) United States Patent
Uzawa

(10) Patent No.: US 6,864,953 B2
(45) Date of Patent: Mar. 8, 2005

(54) EXPOSURE APPARATUS, DEVICE MANUFACTURING METHOD, SEMICONDUCTOR MANUFACTURING PLANT AND METHOD OF MAINTAINING EXPOSURE APPARATUS

(75) Inventor: Shigeyuki Uzawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 537 days.

(21) Appl. No.: 09/865,454

(22) Filed: May 29, 2001

(65) Prior Publication Data

US 2001/0048084 A1 Dec. 6, 2001

(30) Foreign Application Priority Data

May 31, 2000 (JP) ........................................ 2000-163845

(51) Int. Cl.[7] ............................................ G03B 27/42
(52) U.S. Cl. ........................................... 355/53; 355/30
(58) Field of Search ............................ 438/14; 355/30, 355/53

(56) References Cited

U.S. PATENT DOCUMENTS

| | | |
|---|---|---|
| 5,138,643 A | 8/1992 | Sakamoto et al. ............ 378/34 |
| 5,160,961 A | 11/1992 | Marumo et al. ............... 355/53 |
| 5,168,512 A | 12/1992 | Iwamoto et al. .............. 378/34 |
| 5,172,403 A | 12/1992 | Tanaka et al. ................. 378/34 |
| 5,822,389 A | 10/1998 | Uzawa et al. ................. 378/34 |
| 6,222,610 B1 * | 4/2001 | Hagiwara .................... 355/30 |
| 6,545,746 B1 * | 4/2003 | Nishi .......................... 355/53 |

* cited by examiner

*Primary Examiner*—John Niebling
*Assistant Examiner*—Andre' Stevenson
(74) *Attorney, Agent, or Firm*—Fitzpatrick, Cella, Harper & Scinto (57) ABSTRACT

An exposure apparatus for performing exposure of patterns of a reticle onto a substrate includes a first housing covering an optics space containing members of an optical system of an optical path of exposing light, a second housing covering a drive space containing driving members, which adjoins the optics space, members transparent to exposing light provided at boundaries of the adjacent first and second housings, a gas supplier which supplies the interior of the first and second housings with a purging gas, pressure sensors which sense pressures inside respective ones of the first and second housings, and a control unit which controls the gas supplier on the basis of outputs from the pressure sensors in such a manner that pressures within the respective first and second housings will attain respective ones of predetermined pressures.

28 Claims, 8 Drawing Sheets

```
URL  http://www.maintain.co.jp/db/input.html

MALFUNCTION DATABASE INPUT SCREEN

DATE OF OCCURRENCE  2000/3/15  ~404
MODEL  * * * * * * * * *  ~401
SUBJECT MATTER  OPERATING MALFUNCTION (ERROR AT BOOTING)  ~403
EQUIPMENT SERIAL NO. S/N  465NS4580001  ~402
DEGREE OF URGENCY  D  ~405
CONDITION  LED CONTINUES FLASHING AFTER
           POWER IS TURNED ON                    ~406

COUNTERMEASURE  POWER TURNED ON AGAIN
METHOD          (RED BUTTON PUSHED AT START UP)  ~407

PROGRESS  TEMPORARY MEASURES COMPLETED
REPORT                                           ~408

[SEND] [RESET]       410              411                412
LINK TO DATABASE OF RESULTS   SOFTWARE LIBRARY   OPERATING GUIDE
```

FIG. 7

SEMICONDUCTOR DEVICE MANUFACTURING FLOW

FIG. 8

EXPOSURE APPARATUS, DEVICE MANUFACTURING METHOD, SEMICONDUCTOR MANUFACTURING PLANT AND METHOD OF MAINTAINING EXPOSURE APPARATUS

FIELD OF THE INVENTION

This invention relates to an exposure apparatus, a device manufacturing method for manufacturing semiconductor devices, a semiconductor manufacturing plant in which the exposure apparatus has been installed, and a method of maintaining the exposure apparatus. More particularly, the invention relates to an exposure apparatus in which the optical axis of exposing light is divided into a plurality of spaces and the spaces are purged independently.

BACKGROUND OF THE INVENTION

In the manufacture of semiconductor devices in recent years, there is an ever increasing tendency to use shorter wavelengths for the exposing light source in the associated exposure apparatus. The reason for this is that using shorter wavelengths raises the resolution of the projection exposure system and makes it possible to expose finer patterns. For example, since an $F_2$ excimer laser has a short wavelength of 157 nm, application of this laser to exposure apparatus is proceeding. However, since exposing light produced by an $F_2$ excimer laser is absorbed in an $O_2$ or $H_2O$ environment, the space traversed by the exposing light must be purged using an inert gas.

Methods adopted to deal with this include a method of placing the overall exposure apparatus inside a tightly sealed chamber and a method of dividing the apparatus into several sections and purging each section.

In a case where the exposure apparatus is divided and purged, however, each individual section is controlled independently. A problem which arises is that a pressure difference develops between the sections and leads to deformation at the boundaries of these sections. Since these boundary areas consist of members that are transparent to the exposing light, even minute deformation of these members worsens the aberration of the exposing light.

SUMMARY OF THE INVENTION

The present invention has been proposed to solve the foregoing problems and an object thereof is to provide an exposure apparatus that is purged in sections, wherein the apparatus is so adapted as to reduce the amount of deformation of an end face, such as the end face of a projection optics system, between purged spaces in the apparatus.

According to a first aspect of the present invention, the foregoing object is attained by providing an exposure apparatus by exposing light emitted from a laser light source such as an $F_2$ excimer laser, comprising: a plurality of housings provided adjacent to one another in order to cover at least part of the optical path of the exposing light; exposing-light-transparent members provided at boundaries of the adjacent housings; a gas supplier which supplies the interior of each housing with a purging gas; pressure sensors which sense pressures inside respective ones of the housings; and a control unit which controls the gas supplier on the basis of outputs from the pressure sensors in such a manner that pressures within the respective housings will attain respective ones of predetermined pressures.

According to a second aspect of the present invention, the foregoing object is attained by providing an exposure apparatus by exposing light emitted from a laser light source such as an $F_2$ excimer laser, comprising: a plurality of housings provided adjacent to one another in order to cover at least part of the optical path of the exposing light; exposing-light-transparent members provided at boundaries of the adjacent housings; a gas supplier which supplies the interior of each housing with a purging gas; differential-pressure sensors which sense differences in pressure between adjacent ones of the housings; and a control unit which controls the gas supplier on the basis of outputs from the differential-pressure sensors in such a manner that pressures within the respective housings will attain respective ones of predetermined pressures.

In a preferred embodiment, a unit which regulates pressure includes pressure sensors provided in respective ones of the housings or differential-pressure sensors provided between the plurality of housings (e.g., directly in the partition walls of adjacent purge spaces), and air conditioners capable of introducing inert gas to respective ones of the housings and exhausting gas from the interior of respective ones of the housings. The air conditioners are operated while adjusting, e.g., the ratio of an amount of inert gas introduced to the amount of exhaust in accordance with measurement values from the pressure sensors or differential-pressure sensors in such a manner that interiors of the purge spaces attain predetermined pressures.

The plurality of spaces can be classified broadly into an optics space containing members of the optical system, and a drive space containing driving members. The optics space can be divided into a guiding optics space for introducing laser light into the apparatus, an illuminating optics space for illuminating a reticle with exposing light, and a projection optics space for projecting the reticle pattern onto a substrate. The drive space can be divided into a reticle-stage space containing a reticle stage on which the reticle is mounted, a substrate-stage space containing a substrate stage on which the substrate is mounted, and a masking-blade space containing a masking blade. By thus finely partitioning the exposure space, the purge spaces can be reduced in size. This makes is possible to reduce the amount of inert gas consumed and to lower the operating cost greatly.

The inert gas should be one that is inert to reticles and wafers. Examples of inert gas that can be used are nitrogen gas, helium, etc. Using a combination of inert gases is desirable, such as adopting a helium atmosphere for the optics space and a nitrogen-gas atmosphere for the drive space.

Further, a purge space requiring a high level of cleanliness, as in the case of the projection optics space, should be held at a pressure slightly higher than that of the other purge spaces. This is effective in holding cleanliness-sensitive spaces at a high level of cleanliness. In this case, however, there is the danger that optical performance will be affected if the boundary members are deformed. It is, therefore, necessary to exercise control in such a manner that the differential pressure of neighboring purge spaces will fall within predetermined limits.

The range of differential pressures is decided in accordance with an amount of deformation of a boundary member (optical element) with respect to a difference in pressure, and an amount of change in optical performance, which is found from the amount of deformation. As one example, assume that a certain projection optics boundary consists of a flat plate $SiO_2$ having a thickness of 3 mm. In such a case, the pressure difference should be on the order of 0.05 to 5 hPa, and preferably on the order of 0.5 hPa. It cannot be said unqualifiedly that the value of 0.5 hPa is optimum because the optimum value differs depending upon the design of the optical system. In the case of this particular example, it should be so arranged that the pressures for a wafer stage (W), reticle stage (R), illuminating system (S), guiding optics (T), laser (L) and masking blade (MB) be as follows with respect to the pressure of the projection optics (P) (where the unit of pressure is hPa):

$P-0.5<W<P-0.1$
$P-0.5<R<P-0.1$
$R<S<R+0.5$
$S-0.5<T<S-0.1$
$T-0.5<L<S$
$P-0.5<MB<P-0.1$.

The network software provides the display with a user interface for accessing a maintenance database, which is connected to an external network of a plant at which the exposure apparatus has been installed, the database being provided by a vendor or user of the exposure apparatus. This makes it possible to attain the advantages discussed below.

A device manufacturing method according to the present invention comprises steps of placing a group of manufacturing equipment for performing various processes, inclusive of the above-described exposure apparatus in a plant for manufacturing semiconductor devices, and manufacturing a semiconductor device by performing a plurality of processes using this group of manufacturing equipment.

Furthermore, the method of manufacturing semiconductor devices may further include the steps of interconnecting the group of manufacturing equipment by a local-area network, and communicating, by data communication, information relating to at least one item of manufacturing equipment in the group thereof between the local-area network and an external network outside the semiconductor manufacturing plant.

Further, an arrangement may be adopted in which maintenance information for the manufacturing equipment is obtained by accessing, by data communication via the external network, a database provided by a vendor or user of exposure apparatus, or production management is performed by data communication with a semiconductor manufacturing plant other than the first-mentioned plant via the external network.

A semiconductor manufacturing plant according to the present invention comprises: a group of items of manufacturing equipment for performing various processes, inclusive of the above-described exposure apparatus according to the present invention, a local-area network which interconnects the group of items of manufacturing equipment, and a gateway which makes it possible for the local-area network to access an external network outside the plant, wherein information relating to at least one item of manufacturing equipment among the group thereof is capable of being communicated by data communication.

A method of maintaining an exposure apparatus according to the present invention comprises the steps of: providing, by a vendor or user of the exposure apparatus, a maintenance database connected to an external network of a semiconductor manufacturing plant, allowing the maintenance database to be accessed from inside the semiconductor manufacturing plant via the external network, and transmitting maintenance information, which has been stored in the maintenance database, to the semiconductor manufacturing plant via the external network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Preferred embodiments of the present invention will now be described in detail in accordance with the accompanying drawings.

First Embodiment

Figure 1:
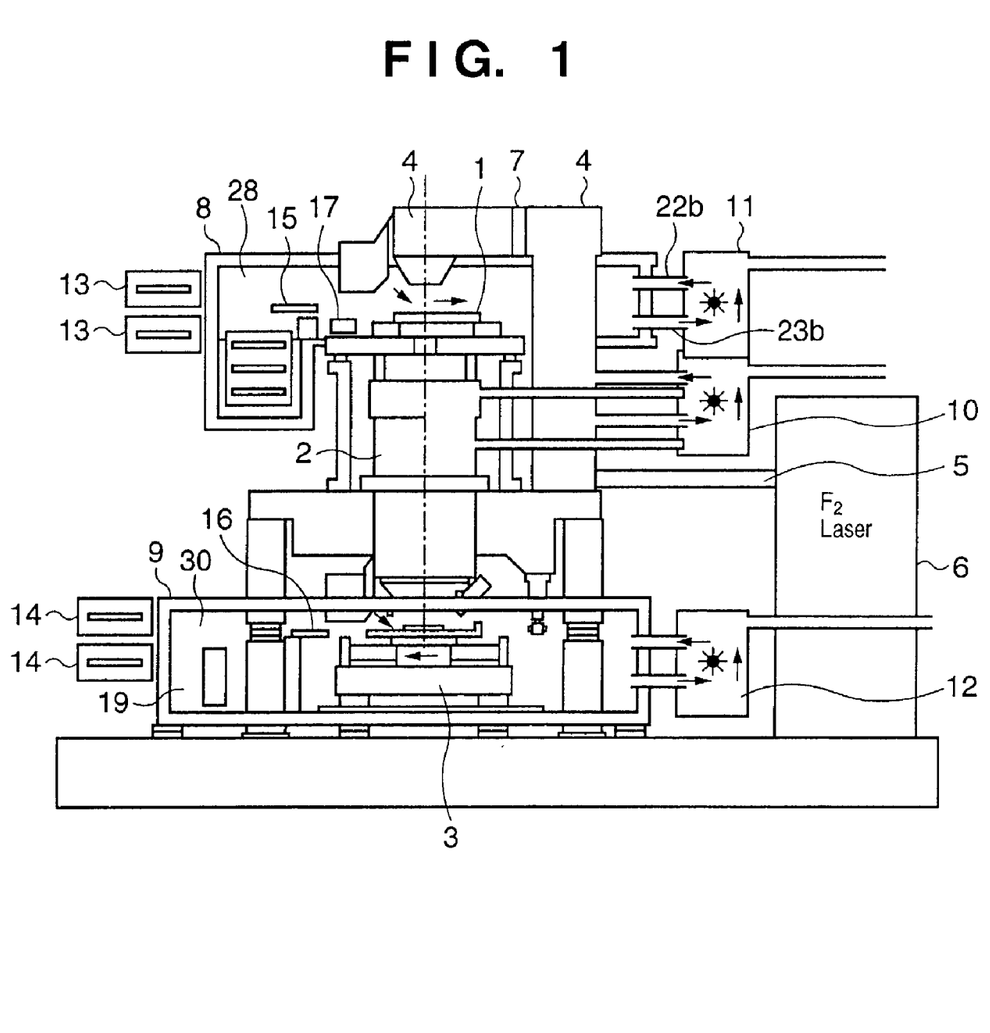
FIG. 1 is a sectional schematic view illustrating an example of a semiconductor exposure apparatus in which an $F_2$ excimer laser serves as the light source.

FIG. 1 is a sectional schematic view illustrating an example of a semiconductor exposure apparatus according to the present invention in which an $F_2$ excimer laser serves as the light source.

Shown in FIG. 1 are a reticle stage 1 on which has been mounted a reticle bearing a pattern, a projecting optics unit (lens barrel) 2 for projecting the pattern on the reticle onto a wafer (substrate), and a wafer stage 3 on which the wafer has been mounted for driving the wafer in the X, Y, Z, θ and tilt directions.

The apparatus further includes an illuminating optics unit 4 for irradiating the reticle with illuminating light; a guiding optics unit 5 for guiding exposing light from the light source to the illuminating optics unit 4; an $F_2$ laser unit 6 serving as the light source; a masking plate 7 for masking the exposing light in such a manner that an area other than the pattern on the reticle will not be illuminated; and housings 8, 9 enclosing the reticle stage 1 and wafer stage 3 to cover the optical axis of the exposing light.

The apparatus further includes a helium air conditioner 10 for adjusting the interiors of the lens barrel 2 and illuminating optics unit 4 to a prescribed helium atmosphere; nitrogen-gas air conditioners 11 and 12 for adjusting the interiors of the housings 8 and 9, respectively, to a prescribed nitrogen-gas atmosphere; a reticle loading lock 13 and a wafer loading lock 14 used when a reticle and a wafer are carried into the housings 8 and 9, respectively; a reticle hand 15 and a wafer hand 16 for transporting a reticle and a wafer, respectively; a reticle alignment mark 17 used when the reticle position is adjusted; a reticle storage bin 18 for storing a plurality of reticles inside the housing 8; and a prealignment unit 19 for performing wafer prealignment. The helium air conditioner 10 and nitrogen-gas air conditioners 11, 12 function as gas suppliers for supplying these gases, which are inert with the reticle and wafer.

Figure 2:
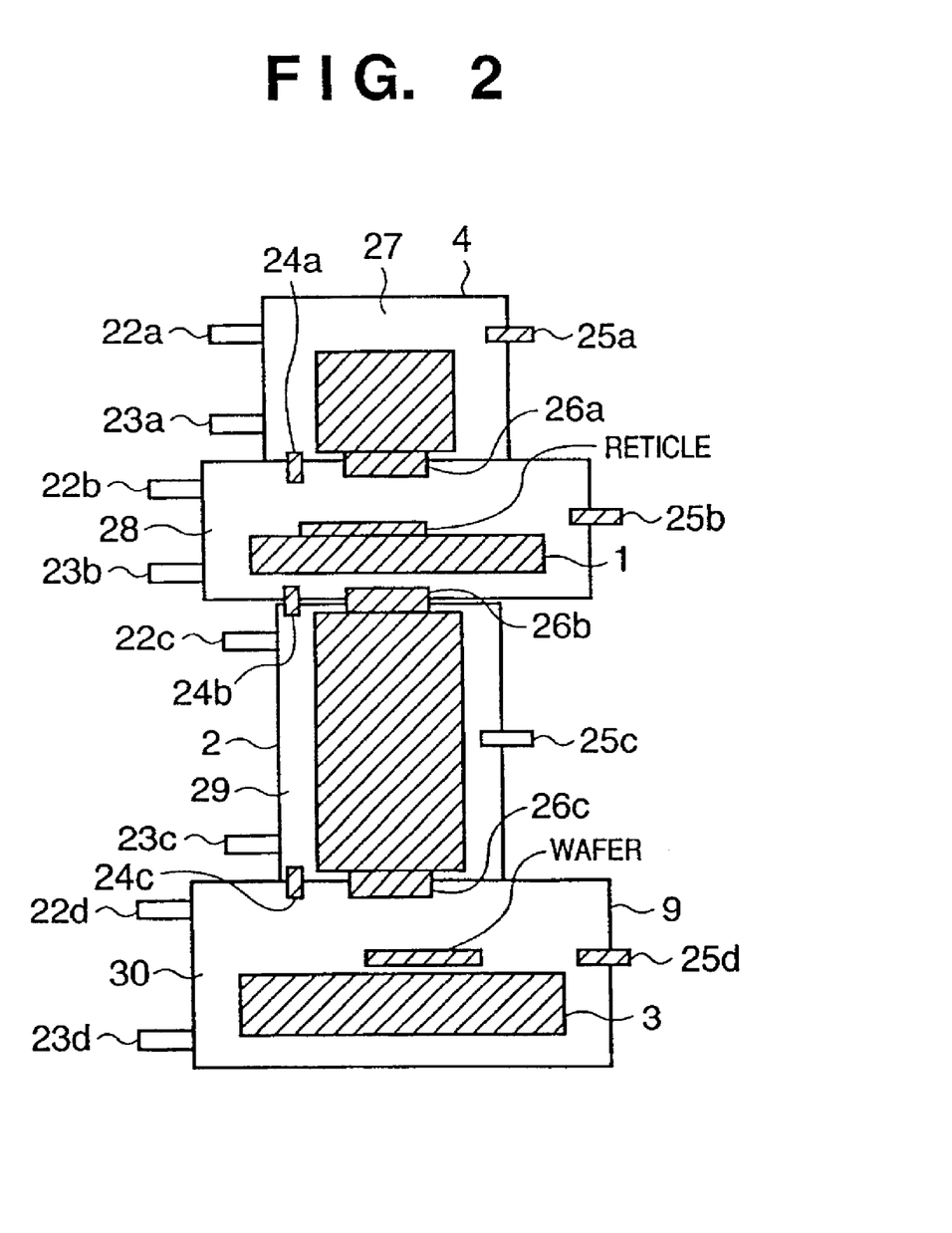
FIG. 2 is a sectional schematic view useful in describing regulation of pressure in the semiconductor exposure apparatus.

FIG. 2 is a sectional schematic view useful in describing adjustment of pressure in each purge space of the exposure apparatus according to this embodiment. The apparatus includes a feed pipe 22a for feeding helium gas serving as a purging gas from the helium air conditioner 10 to an illuminating optics space 27 inside the illuminating optics unit 4; a feed pipe 22b for feeding nitrogen gas serving as a purging gas from the nitrogen-gas air conditioner 11 to a reticle-stage space 28 enclosed by the housing 8; a feed pipe 22c for feeding helium gas serving as a purging gas from the helium air conditioner 10 to a lens-barrel space 29 inside the projecting optics unit 2; and a feed pipe 22d for feeding nitrogen gas serving as a purging gas from the nitrogen-gas air conditioner 12 to a substrate-stage space 30 enclosed by the housing 9.

The apparatus further includes an exhaust pipe 23a for exhausting the purging gas from the illuminating optics space 27 to the helium air conditioner 10; an exhaust pipe 23b for exhausting the purging gas from the reticle-stage space 28 to the nitrogen-gas air conditioner 11; an exhaust pipe 23c for exhausting the purging gas from the lens-barrel space 29 to the helium air conditioner 10; and an exhaust pipe 23d for exhausting the purging gas from the substrate-stage space 30 to the nitrogen-gas air conditioner 12.

The apparatus further includes differential-pressure gauges (differential-pressure sensors) 24a, 24b and 24c for measuring the differential pressures between neighboring purge spaces. Specifically, the differential-pressure sensor 24a measures the differential pressure between the illuminating optics space 27 and the reticle-stage space 28, the differential-pressure sensor 24b measures the differential pressure between the reticle-stage space 28 and the lens-barrel space 29, and the differential-pressure sensor 24c measures the differential pressure between the lens-barrel space 29 and the substrate-stage space 30. These differential-pressure gauges are provided directly in the partitioning walls between the neighboring purge spaces. A pressure gauge (pressure sensor) 25a measures the internal pressure of the illuminating optics space 27, a pressure gauge 25b measures the internal pressure of the reticle-stage space 28, a pressure gauge 25c measures the internal pressure of the lens-barrel space 29, and a pressure gauge 25d measures the internal pressure of the substrate-stage space 30. The apparatus is provided with flat plates (exposing-light-transparent members) 26a, 26b, 26c of $SiO_2$ having a thickness of 3 mm. These plates are disposed in the optical path of the exposing light and are adapted in such a manner that the outer walls of the respective housings will not block the exposing light. The flat plates 26a to 26c may consist of a fluorine compound such as calcium fluoride or magnesium fluoride.

In this specification, the spaces such as the illuminating optics space 27 and lens-barrel space 29 that include optical members shall be referred to as optics spaces, and the spaces such as the reticle-stage space 28, substrate-stage space 30 and masking-blade space that include drive members shall be referred to as drive spaces. The reticle-stage space 28 signifies a space that contains the reticle stage 1, the substrate-stage space 30 signifies a space that contains the wafer stage 3, and the masking-blade space specifies a space that contains the masking plate 7.

Control of each purge space according to this embodiment will now be described with reference to FIGS. 1 and 2.

This apparatus is controlled in such a manner that the pressure inside the lens-barrel space 29 is held constant so as not to be changed by atmospheric pressure. Control of the lens-barrel space 29 is carried out by measuring internal pressure of the lens barrel 2 by the pressure gauge 25c and adjusting the ratio of the amount of helium introduced by the feed pipe 22c from the helium air conditioner 10 to the amount of exhaust exhausted by the feed pipe 23c using control valves (not shown) based upon the measured value of internal pressure.

The control valves, which are provided in the air conditioners 10, 11 and 12, each function to control the ratio of the amount of purging gas supplied to the amount of exhaust, thereby regulating the pressures within the purge spaces 27 to 30. At this time, whichever of the purge spaces requires a high level of cleanliness is held at a pressure higher than that of the neighboring purge spaces. The control valves are controlled by a control unit, which is not shown. By way of example, the control unit controls the control valves based upon the outputs of the pressure gauges 24a to 24d.

The reticle-stage space 28 has its original pressure regulated using control valves (not shown) to adjust the ratio of the amount of helium introduced by the feed pipe 22b from the nitrogen-gas air conditioner 11 to the amount of exhaust exhausted by the feed pipe 23c in such a manner that the differential pressure between the reticle-stage space 28 and the lens-barrel space 29 falls within a predetermined range, with the pressure regulation being performed based upon the value from the differential-pressure sensor 24b provided in the partitioning wall between the reticle-stage space 28 and the lens-barrel space 29. Similarly, the substrate-stage space 30 has its internal pressure regulated using control valves (not shown) to adjust the ratio of the amount of nitrogen gas introduced by the feed pipe 22d from the nitrogen-gas air conditioner 11 to the amount of exhaust exhausted by the feed pipe 23d in such a manner that the differential pressure between the substrate-stage space 30 and the lens-barrel space 29 falls within a predetermined range, with the pressure regulation being performed based upon the value from the differential-pressure sensor 24c provided in the partitioning wall between the substrate-stage space 30 and the lens barrel space 29.

The illuminating optics space 27 has its internal pressure regulated using control valves (not shown) to adjust the ratio of the amount of helium introduced by the feed pipe 22a from the helium air conditioner 10 to the amount of exhaust exhausted by the feed pipe 23a in such a manner that the differential pressure between the illuminating optics space 27 and reticle-stage space 28 falls within a predetermined range, with the pressure regulation being performed based upon the value from the differential-pressure sensor 24a provided in the partitioning wall between the illuminating optics space 27 and the reticle-stage space 28. Similarly, the space for the masking plate 7 and the space for the guiding optics unit 5 are regulated in such a manner that the differential pressures between the respective neighboring purge spaces are rendered constant.

The pressure within each housing is controlled in such a manner that the amount of deformation of members caused by a difference in pressure with respect to the pressure within the neighboring housing will fall within a range of pressures that will not have a significant effect upon optical performance. More specifically, the range of differential pressures is decided in accordance with the amount of deformation of each of the boundary members 26a, 26b, 26c, which are optical elements, with respect to a difference in pressure, and an amount of a change in optical performance, which is found from the amount of deformation. The pressure difference is adjusted to 0.5 hPa.

In this embodiment, the pressures of a wafer stage (W), reticle stage (R), illuminating system (S), guiding optics (T), laser (L) and masking blade (MB) are controlled so as to fall within the following ranges with respect to the pressure of the projection optics (P) (wherein the unit pressure is hPa):

P−0.5<W<P−0.1
P−0.5<R<P−0.1
R<S<R+0.5
S−0.5<T<S−0.1
T−0.5<L<S
P−0.5<MB<P−0.1.

In accordance with this embodiment, the pressures within the lens-barrel space 29 and illuminating optics space 27 can be held above those of the neighboring drive spaces by a minute range at all times even if the internal pressures of the drive spaces fluctuate owing to loading and unloading of wafers and reticles.

Further, since a fluctuation in the internal pressure of each purge space can be held to a minimum, a fluctuation in the amount of deformation of each of the boundary members 26a to 26c can be held to a minimum at all times. Furthermore, since the purge spaces such as the drive spaces are reduced in size as a result of partitioning, the amount of inert gas used can be reduced, thereby making it possible to operate the apparatus inexpensively.

Thus, in accordance with this embodiment, the amount of deformation of the end face of a projecting optics unit is reduced in an exposure apparatus that is purged in sections. Further, the levels of cleanliness of the partitioned sections can be ranked and the section most sensitive to cleanliness can be held at the highest level of cleanliness.

Though one lens-barrel space 29, which is a space within the projecting optics unit 2, is provided in this embodiment, the invention is not limited to this arrangement. For example, the space within the projecting optics unit 2 may be divided into a plurality of spaces and these may be purged. In such a case, each space within the projecting optics unit 2 would be provided with a pressure gauge and pressure gauges would be provided for measuring the differential pressures between the neighboring spaces. It should be noted that if the space within the projecting optics unit 2 is divided into a plurality of spaces, the lenses of the projecting optics unit perform the role of the partitioning walls between the spaces. Further, in a case where a magnification correction lens in the projecting optics unit 2 moves, the internal space would be divided into a space that includes the magnification correction lens and spaces that include the other lenses.

Second Embodiment

In this embodiment, each pressure range is decided in advance in such a manner that the differential pressures between neighboring purge spaces will be rendered constant. Accordingly, the internal pressures of the purge spaces are regulated by the pressure gauges 24a to 24d. This embodiment is similar to the first embodiment in other respects.

In accordance with this embodiment, the range of pressures in each purge space can be held constant. By setting the area of fluctuation to a desired range, the optics space can be kept clean at all times in a manner similar to that of the first embodiment. Further, since the pressure within the illuminating optics unit 4 will not fluctuate in association with any fluctuation in pressure within neighboring purge spaces (e.g., the reticle-stage space 28, the space containing the masking plate 7, etc.), there is no danger that optical performance of the illuminating optics unit 4 will change. Further, as in the first embodiment, a boundary member that is transparent to exposing light is provided between the adjacent housings that define the purge spaces.

Third Embodiment

Figure 3:
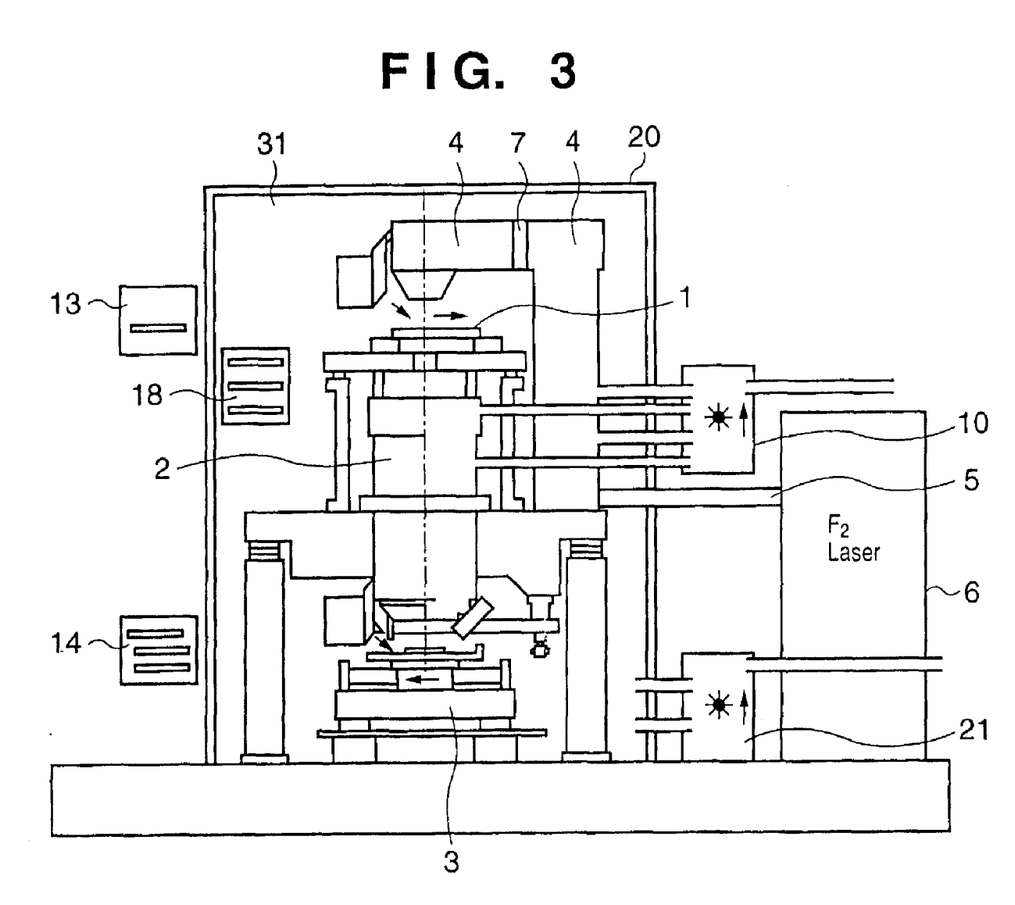
FIG. 3 is a sectional schematic view illustrating another example of a semiconductor exposure apparatus in which an $F_2$ excimer laser serves as the light source.

FIG. 3 is a sectional schematic view illustrating another example of a semiconductor exposure apparatus in which an $F_2$ excimer laser serves as the light source according to the present invention.

As shown in FIG. 3, a housing 20 encompasses the entire exposure apparatus. The lens barrel 2 and illuminating optics unit 4 are provided inside the housing 20. An air conditioner 21 establishes a nitrogen-gas atmosphere within the entirety of the housing 20. In this embodiment, the internal spaces of the lens barrel 2 and illuminating optics unit 4 are isolated from the internal space (a drive space 31) of the housing 20 and are regulated independently to establish a helium atmosphere in each.

The method of controlling the pressures within the purge spaces of this embodiment is similar to that of the first and second embodiments. However, since the interior of the drive space 3 is controlled collectively, the apparatus can be constructed more simply and at a lower cost.

Embodiment of a Semiconductor Production System

Described next will be an example of a system for producing semiconductor devices (e.g., semiconductor chips such as ICs and LSI chips, liquid crystal panels, CCDs, thin-film magnetic heads and micromachines, etc.). This system utilizes a computer network outside the semiconductor manufacturing plant to provide troubleshooting and regular maintenance of manufacturing equipment installed at the manufacturing plant and to furnish maintenance service such as the provision of software.

Figure 4:
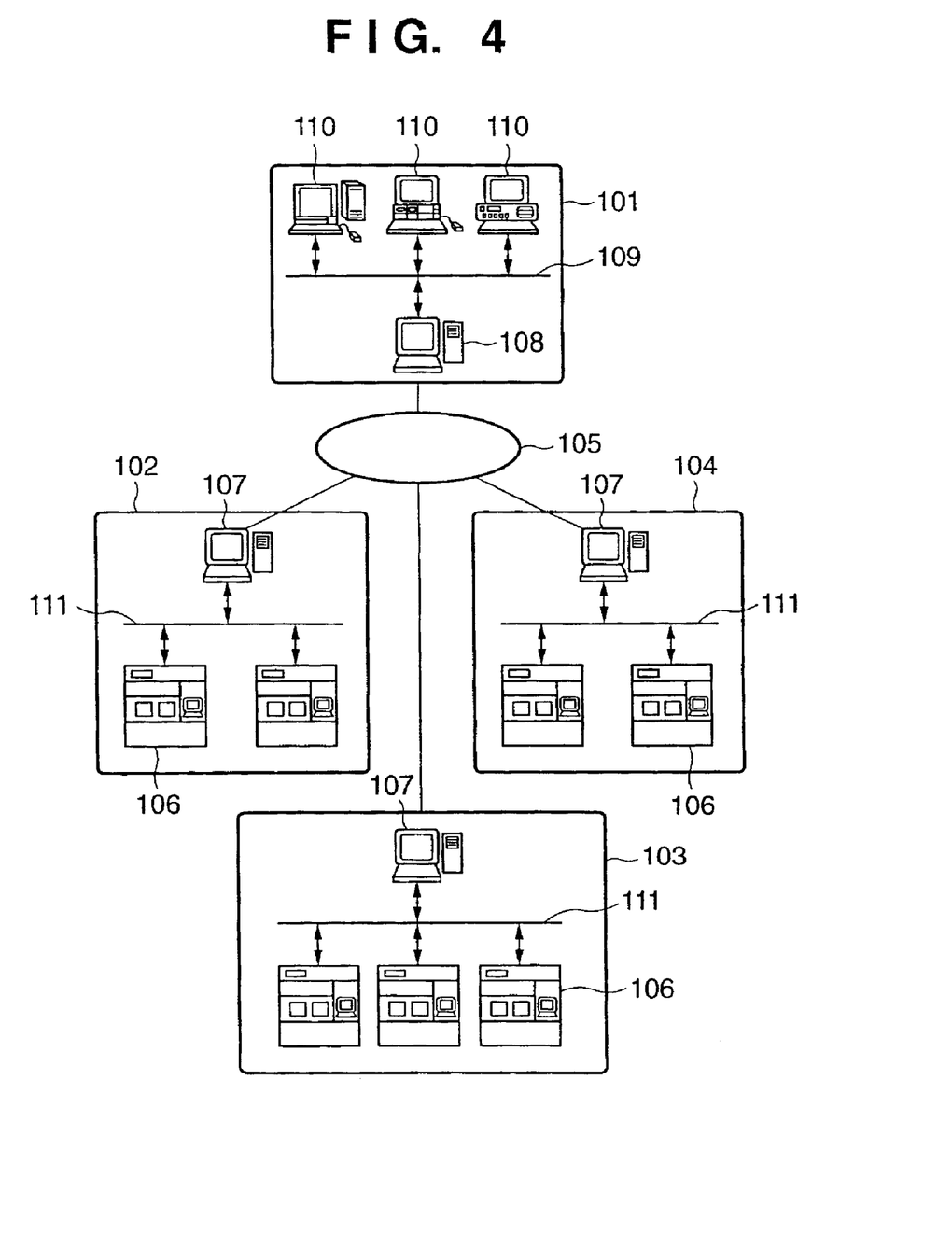
FIG. 4 is a conceptual view showing a semiconductor device production system as seen from a certain angle.

FIG. 4 illustrates the overall system as seen from a certain angle. The system includes the business office 101 of the vendor (equipment supplier) that provides the equipment for manufacturing semiconductor devices. Semiconductor manufacturing equipment for performing various processes used in a semiconductor manufacturing plant is assumed to be the manufacturing equipment. Examples of the equipment are pre-treatment equipment (e.g., lithographic equipment such as exposure equipment, resist treatment equipment and etching equipment, heat treatment equipment, thin-film equipment and smoothing equipment, etc.) and post-treatment equipment (e.g., assembly equipment and inspection equipment, etc.). The business office 101 includes a host management system 108 for providing a manufacturing-equipment maintenance database, a plurality of control terminal computers 110, and a local-area network (LAN) 109 for connecting these components into an intranet. The host management system 108 has a gateway for connecting the LAN 109 to the Internet 105, which is a network external to the business office 101, and a security function for limiting access from the outside.

Numerals 102 to 104 denote manufacturing plants of semiconductor makers which are the users of the manufacturing equipment. The manufacturing plants 102 to 104 may be plants belonging to makers that differ from one another or plants belonging to the same maker (e.g., pre-treatment plants and post-treatment plants, etc.). Each of the plants 102 to 104 is provided with a plurality of pieces of manufacturing equipment 106, a local-area network (LAN) 111, which connects these pieces of equipment to construct an intranet, and a host management system 107 serving as a monitoring unit for monitoring the status of operation of each piece of manufacturing equipment 106. The host management system 107 provided at each of the plants 102 to 104 has a gateway for connecting the LAN 111 in each plant to the Internet 105 serving as the external network of the plants. As a result, it is possible for the LAN of each plant to access the host management system 108 on the side of the vendor 101 via the Internet 105. By virtue of the security function of the host management system 108, users allowed to access the host management system 108 are limited.

More specifically, status information (e.g., the condition of manufacturing equipment that has malfunctioned), which indicates the status of operation of each piece of manufacturing equipment 106, can be reported from the plant side to the vendor side. In addition, information in response to such notification (e.g., information specifying how to troubleshoot the problem, troubleshooting software and data, etc.), as well as the latest software and maintenance information such as help information, can be acquired from the vendor side. A communication protocol (TCP/IP), which is used generally over the Internet, is employed for data communication between the plants 102~104 and the vendor 101 and for data communication over the LAN 111 within each plant. Instead of utilizing the Internet as the external network of a plant, it is also possible to utilize a highly secure leased-line network (ISDN, etc.) that cannot be accessed by a third party.

Further, the host management system is not limited to that provided by a vendor, for an arrangement may be adopted in which the user constructs a database, places it on an external network and allows the database to be accessed from a number of plants that belong to the user.

Figure 5:
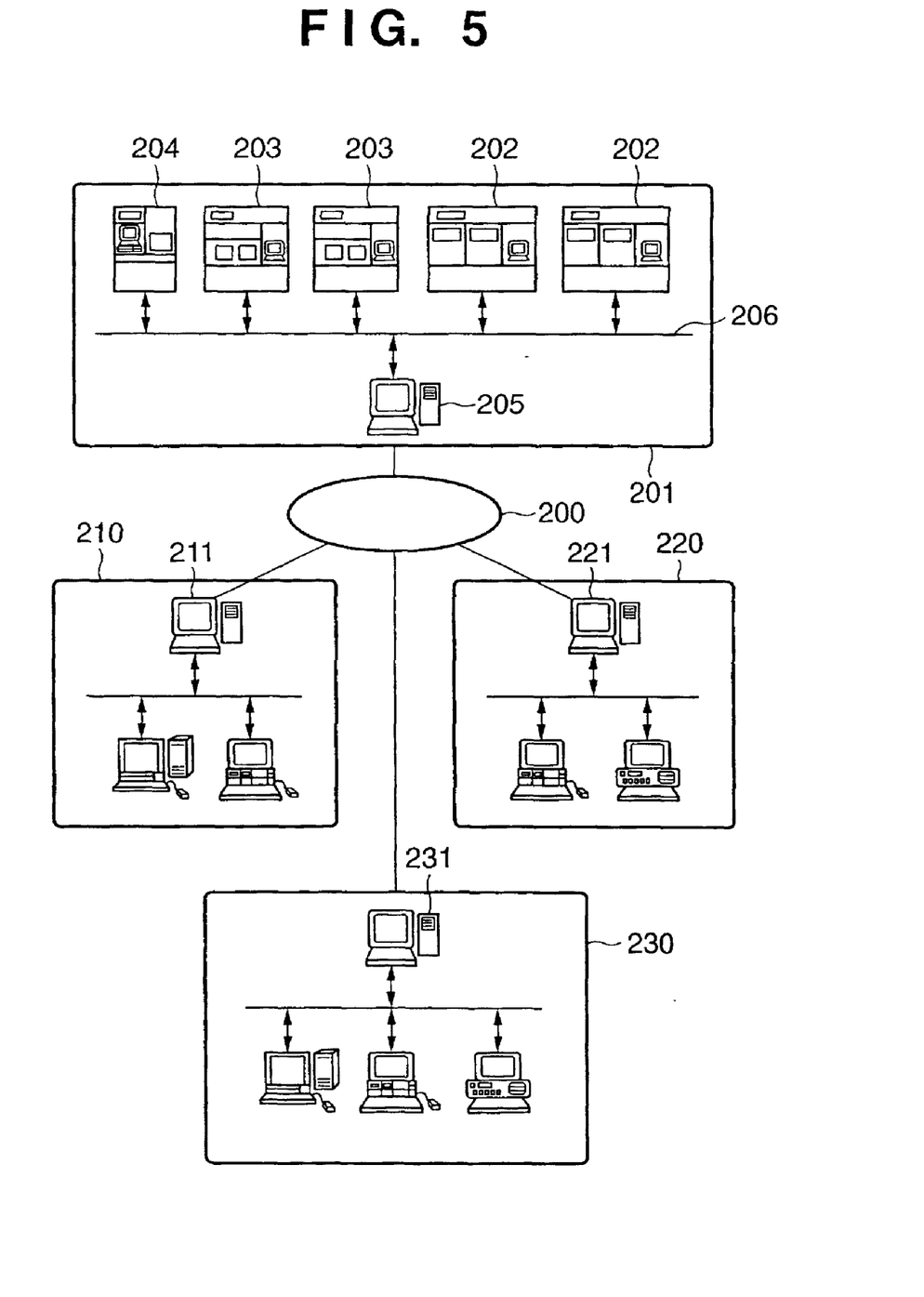
FIG. 5 is a conceptual view showing a semiconductor device production system as seen from another angle.

FIG. 5 is a conceptual view illustrating the overall system of this embodiment as seen from an angle different from that depicted in FIG. 4. In the earlier example, a plurality of user plants each having manufacturing equipment are connected by an external network to the management system of the vendor that provided the manufacturing equipment, and information concerning the production management of each plant and information concerning at least one piece of manufacturing equipment is communicated by data communication via the external network. In the example of FIG. 5, on the other hand, a plant having manufacturing equipment provided by a plurality of vendors is connected by an outside network to management systems of pieces of manufacturing equipment, and maintenance information for each piece of manufacturing equipment is communicated by data communication. This system includes a manufacturing plant 201 of the user of the manufacturing equipment (e.g., the maker of semiconductor devices). The manufacturing line of this plant includes manufacturing equipment for implementing a variety of processes. Examples of such equipment are exposure equipment 202, resist treatment equipment 203, and thin-film treatment equipment 204.

Though only one manufacturing plant 201 is shown in FIG. 5, in actuality, a plurality of these plants are networked in the same manner. The pieces of equipment in the plant are interconnected by LAN 206 to construct an intranet and the operation of the manufacturing line is managed by a host management system 205. The business offices of vendors (e.g., equipment suppliers) such as an exposure equipment maker 210, a resist treatment equipment maker 220 and a thin-film treatment equipment maker 230 have host management systems 211, 221, 231, respectively, for performing remote maintenance of the equipment they have supplied. These have maintenance databases and gateways to the outside network, as described earlier. The host management system 205 for managing each piece of equipment in the manufacturing plant of the user is connected to the management systems 211, 221, 231 of the vendors of these pieces of equipment by the Internet or leased-line network serving as an external network 200. If any of the series of equipment in the manufacturing line malfunctions, the line ceases operating. However, this can be dealt with rapidly by receiving remote maintenance from the vendor of the faulty equipment via the Internet 200, thereby making it possible to minimize line downtime.

Each piece of manufacturing equipment installed in the semiconductor manufacturing plant has a display, a network interface and a computer for executing network-access software and equipment operating software stored in a storage device.

Figure 6:
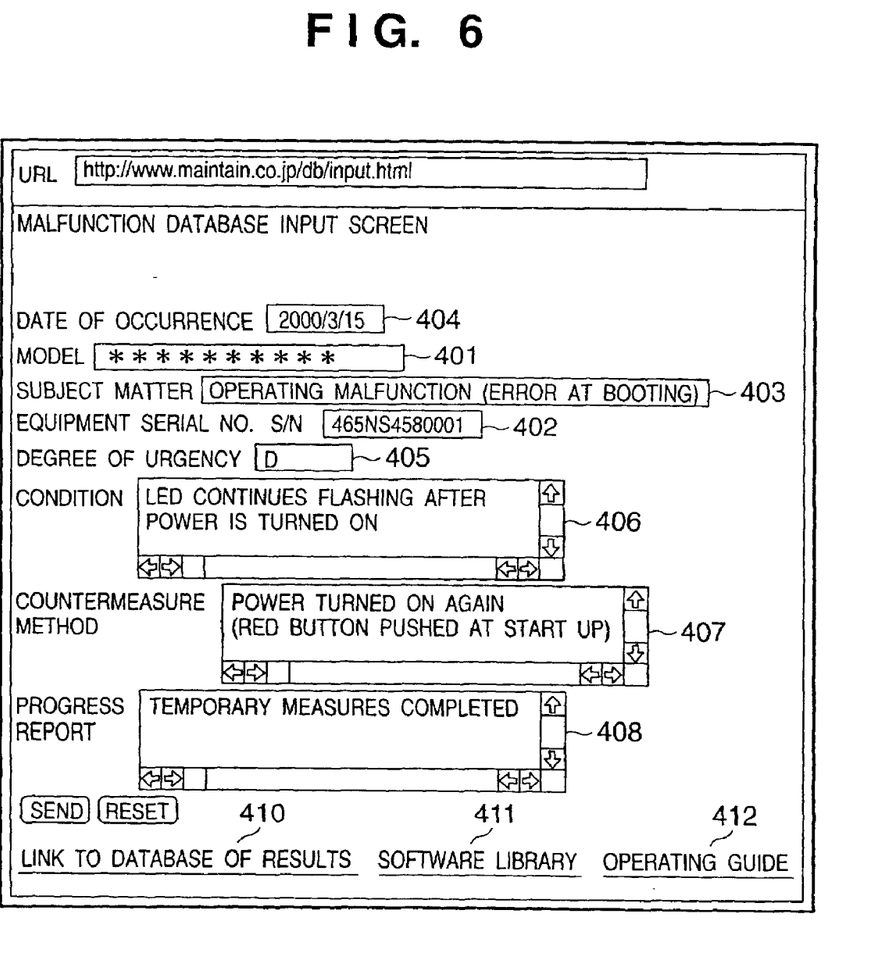
FIG. 6 shows a specific example of a user interface.

The storage device can be an internal memory or a hard disk or a network file server. The software for performing network access includes a special-purpose or general-purpose Web browser and presents a user interface, which has a screen of the kind shown by way of example in FIG. 6, on the display. The operator managing the manufacturing equipment at each plant enters information at the input items on the screen while observing the screen. The information includes model (401) of the manufacturing equipment, its serial number (402), subject matter (403) of the problem, its date of occurrence (404), degree of urgency (405), the particular condition (406), countermeasure method (407) and progress report (408). The entered information is transmitted to the maintenance database via the Internet. The resulting appropriate maintenance information is sent back from the maintenance database and is presented on the display screen. The user interface provided by the Web browser implements hyperlink functions (410 to 412) as illustrated and enables the operator to access more detailed information for each item, to extract the latest version of software, which is used for the manufacturing equipment, from a software library provided by the vendor, and to acquire an operating guide (help information) for reference by the plant operator.

Figure 7:
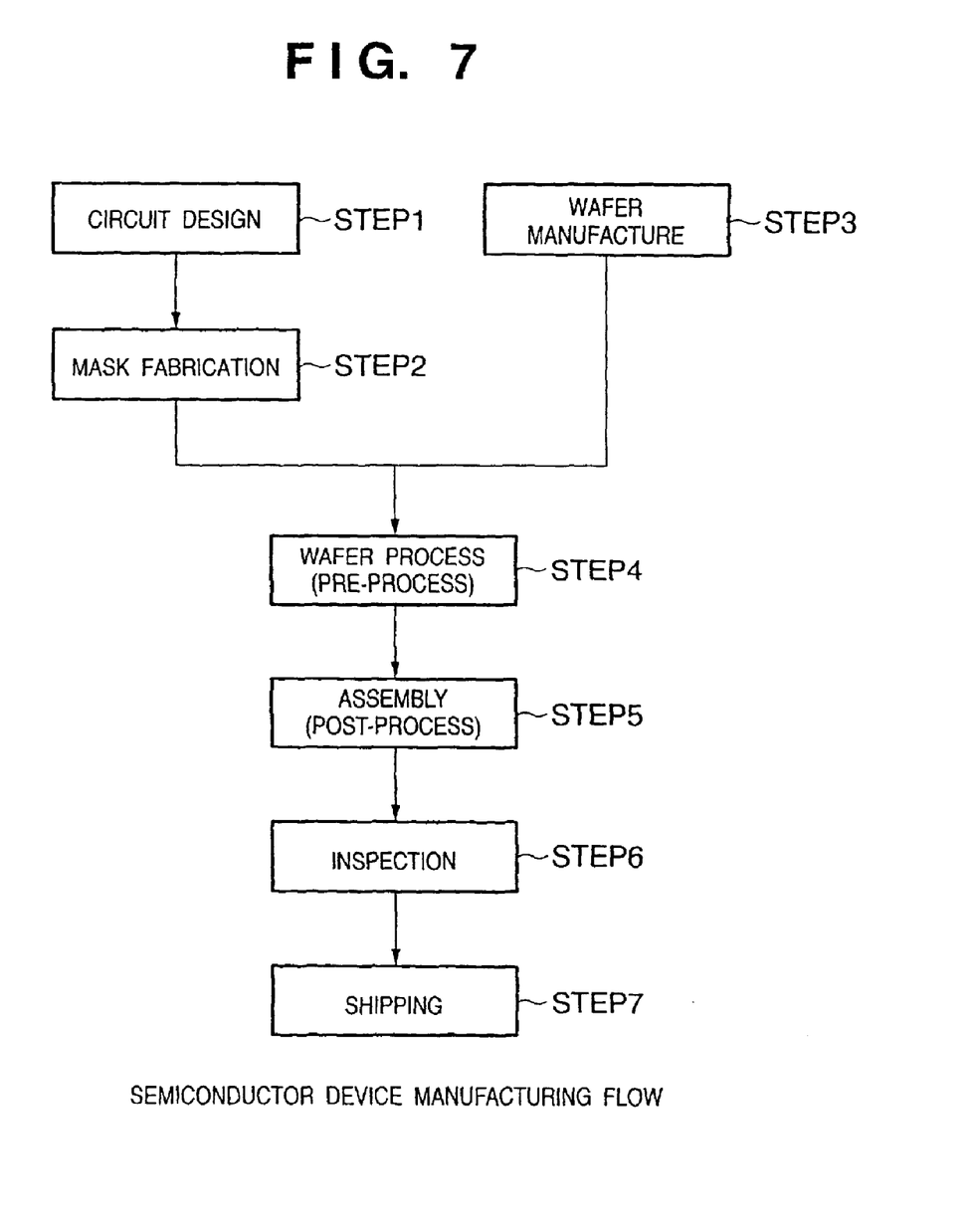
FIG. 7 is a diagram useful in describing the flow of a device manufacturing process.

A process for manufacturing a semiconductor device utilizing the production system set forth above will now be described. FIG. 7 illustrates the overall flow of a process for manufacturing semiconductor devices. The circuit for the device is designed at step 1 (circuit design). A mask on which the designed circuit pattern has been formed is fabricated at step 2 (mask fabrication). Meanwhile, a wafer is manufactured using a material such as silicon or glass at step 3 (wafer manufacture). The actual circuit is formed on the wafer by lithography, using the mask and wafer that have been prepared, at step 4 (wafer process), which is also referred to as a "pre-treatment". A semiconductor chip is obtained, using the wafer fabricated at step 4, at step 5 (assembly), which is also referred to as "post-treatment". This step includes steps such as actual assembly (dicing and bonding) and packaging (chip encapsulation). The semiconductor device fabricated at step 5 is subjected to inspections such as an operation verification test and a durability test at step 6 (inspection). The semiconductor device is completed through these steps and then is shipped (step 7).

The pre- and post-treatments are performed at separate special-purpose plants. Maintenance is carried out on a per-plant basis by the above-described remote maintenance system. Further, information for production management and equipment maintenance is communicated by data communication between the pre- and post-treatment plants via the Internet or leased-line network.

Figure 8:
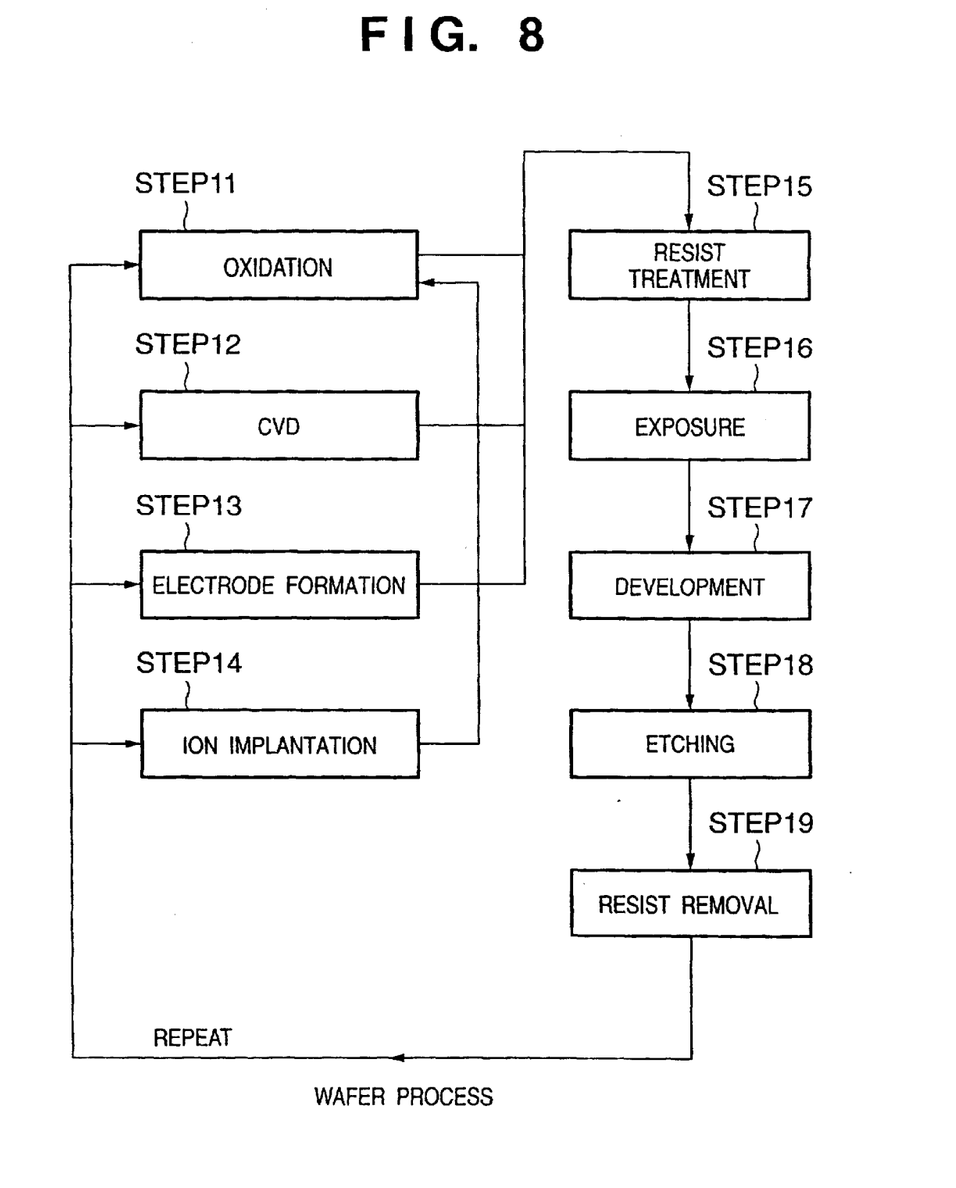
FIG. 8 is a diagram useful in describing a wafer process.

FIG. 8 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described exposure apparatus at step 16 (exposure), and the exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly. Since the manufacturing equipment used at each step is maintained by the remote maintenance system described above, malfunctions can be prevented and quick recovery is possible if a malfunction should happen to occur. As a result, the productivity of semiconductor device manufacture can be improved over the prior art.

Thus, with the exposure apparatus according to the present invention, a plurality of purge spaces within the exposure apparatus are controlled so as to attain respective ones of predetermined pressures, thereby making it possible to reduce the deformation of boundary members between the purge spaces.

Further, with the exposure apparatus according to the present invention, the differential pressure between neighboring purge spaces within the exposure apparatus is controlled, thereby making it possible to reduce the deformation of boundary members between the purge spaces.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for performing exposure of patterns of a reticle onto a substrate, said apparatus comprising:
    a first housing covering an optics space containing members of an optical system of an optical path of exposing light;
    a second housing covering a drive space containing driving members, which adjoins the optics space;
    members transparent to exposing light provided at boundaries of the adjacent first and second housings;
    a gas supplier which supplies the interior of said first and second housings with a purging gas;
    pressure sensors which sense pressures inside respective ones of said first and second housings; and
    a control unit which controls said gas supplier on the basis of outputs from said pressure sensors in such a manner that pressures within the respective first and second housings will attain respective ones of predetermined pressures.

2. An exposure apparatus for performing exposure of patterns of a reticle onto a substrate, said apparatus comprising:
    a first housing covering an optics space containing members of an optical system of an optical path of exposing light;
    a second housing covering a drive space containing driving members, which adjoins the optics space;
    members transparent to exposing light provided at boundaries of the adjacent first and second housings;
    a gas supplier which supplies the interior of said first and second housings with a purging gas;
    differential-pressure sensors which sense differences in pressure between adjacent ones of said first and second housings; and
    a control unit which controls said gas supplier on the basis of outputs from said differential-pressure sensors in such a manner that pressures within the respective first and second housings will attain respective ones of predetermined pressures.

3. The apparatus according to claim 1, wherein said gas supplier includes air conditioners capable of supplying a purging gas to respective ones of said housings and of exhausting gas from the interior of respective ones of said housings, said air conditioners being operated in such a manner that measured values provided by said pressure sensors attain respective ones of the predetermined pressures.

4. The apparatus according to claim 2, wherein said gas supplier includes air conditioners capable of supplying a purging gas to respective ones of said housings and of exhausting gas from the interior of respective ones of said housings, said air conditioners being operated in such a manner that measured values provided by said differential-pressure sensors attain respective ones of the predetermined pressures.

5. The apparatus according to claim 1, wherein said housings include at least one of an optics space containing members of an optical system and a drive space containing driving members.

6. The apparatus according to claim 2, wherein said housings include at least one of an optics space containing members of an optical system and a drive space containing driving members.

7. The apparatus according to claim 1, wherein said optics space is at least one of a guiding optics space for introducing exposing light from a light source into the apparatus, an illuminating optics space for illuminating a reticle with the exposing light, and a projection optics space for projecting the reticle pattern onto the substrate.

8. The apparatus according to claim 2, wherein said optics space is at least one of a guiding optics space for introducing exposing light from a light source into the apparatus, an illuminating optics space for illuminating a reticle with the exposing light, and a projection optics space for projecting the reticle pattern onto the substrate.

9. The apparatus according to claim 1, wherein said drive space is at least one of a reticle-stage space containing a reticle stage on which the reticle is mounted, a substrate-stage space containing a substrate stage on which the substrate is mounted, and a masking-blade space containing a masking blade.

10. The apparatus according to claim 2, wherein said drive space is at least one of a reticle-stage space containing a reticle stage on which the reticle is mounted, a substrate-stage space containing a substrate stage on which the substrate is mounted, and a masking-blade space containing a masking blade.

11. The apparatus according to claim 1, wherein said optics space is a helium atmosphere and said drive space is a nitrogen-gas atmosphere.

12. The apparatus according to claim 2, wherein said optics space is a helium atmosphere and said drive space is a nitrogen-gas atmosphere.

13. The apparatus according to claim 7, wherein said control unit performs control in such a manner that pressure within said projection optics space is held constant.

14. The apparatus according to claim 8, wherein said control unit performs control in such a manner that pressure within said projection optics space is held constant.

15. The apparatus according to claim 1, wherein whichever of said spaces requires a high level of cleanliness is held at a pressure higher than the pressures of the other spaces.

16. The apparatus according to claim 2, wherein whichever of said spaces requires a high level of cleanliness is held at a pressure higher than the pressures of the other spaces.

17. The apparatus according to claim 3, wherein each of said air conditioners has a control valve for controlling a ratio of amount of purging gas supplied to amount of exhaust, and pressure within a corresponding housing is regulated by said control valve.

18. The apparatus according to claim 4, wherein each of said air conditioners has a control valve for controlling a ratio of amount of purging gas supplied to amount of exhaust, and pressure within a corresponding housing is regulated by said control valve.

19. The apparatus according to claim 1, wherein said control unit controls the pressure within each of said housings in a manner that an amount of deformation of said members due to a differential pressure between pressures within adjacent ones of said housings falls within a range in which said differential pressure has no significant effect upon optical performance.

20. The apparatus according to claim 2, wherein said control unit controls the pressure within each of said housings in such a manner that an amount of deformation of said members due to a differential pressure between pressures within adjacent ones of said housings falls within a range in which said differential pressure has no significant effect upon optical performance.

21. The apparatus according to claim 1, wherein a laser light source for said exposure apparatus is an $F_2$ excimer laser source.

22. The apparatus according to claim 2, wherein a laser light source for said exposure apparatus is an $F_2$ excimer laser source.

23. The apparatus according to claim 1, wherein the purging gas is an inert gas.

24. The apparatus according to claim 2, wherein the purging gas is an inert gas.

25. An exposure apparatus capable of performing data communication via a computer network, said apparatus comprising:
   a network interface, which is connected to the network, for performing data communication, a display which displays results of the data communication, and a computer, which is connected to the network, for executing software for communicating data;
   a first housing covering an optics space containing members of an optical system of an optical path of exposing light;
   a second housing covering a drive space containing driving members, which adjoins the optics space;
   members transparent to exposing light provided at boundaries of the adjacent first and second housings;
   a gas supplier which supplies the interior of said first and second housings with a purging gas;
   pressure sensors which sense pressures inside respective ones of said first and second housings; and
   a control unit which controls said gas supplier on the basis of outputs from said pressure sensors in such a manner that pressures within the respective first and second housings will attain respective ones of predetermined pressures.

26. An exposure apparatus capable of performing data communication via a computer network, said apparatus comprising:
   a network interface, which is connected to the network, for performing data communication, a display which displays results of the data communication, and a computer, which is connected to the network, for executing software for communicating data;
   a first housing covering an optics space containing members of an optical system of an optical path of exposing light;
   a second housing covering a drive space containing driving members, which adjoins the optics space;
   members transparent to exposing light provided at boundaries of the adjacent first and second housings;
   a gas supplier which supplies the interior of said first and second housings with a purging gas;
   differential-pressure sensors which sense differences in pressure between adjacent said first and second housings; and
   a control unit which controls said gas supplier on the basis of outputs from said differential-pressure sensors in such a manner that pressures within the respective first and second housings will attain respective ones of predetermined pressures.

27. An exposure apparatus capable of performing data communication via a computer network, said apparatus comprising:
   a network interface, which is connected to the network, for performing data communication, a display which displays results of the data communication, and a computer, which is connected to the network, for executing software for communicating data;
   a first housing covering an optics space containing members of an optical system of an optical path of exposing light;
   a second housing covering a drive space containing driving members, which adjoins the optics space;
   members transparent to exposing light provided at boundaries of the adjacent first and second housings;
   a gas supplier which supplies the interior of said first and second housings with a purging gas;
   pressure sensors which sense pressures inside respective ones of said first and second housings; and
   a control unit which controls said gas supplier on the basis of outputs from said pressure sensors in such a manner that pressures within the respective first and second housings will attain respective ones of predetermined pressures,
   wherein the network software provides said display with a user interface for accessing a maintenance database, which is connected to an external network of a plant at which said exposure apparatus has been installed, and which is provided by a vendor or user of the exposure apparatus, thereby making it possible to obtain information from said database via said external network.

28. An exposure apparatus capable of performing data communication via a computer network, said apparatus comprising:
   a network interface, which is connected to the network, for performing data communication, a display which displays results of the data communication, and a computer, which is connected to the network, for executing software for communicating data;
   a first housing covering an optics space containing members of an optical system of an optical path of exposing light;
   a second housing covering a drive space containing driving members, which adjoins the optics space;
   members transparent to exposing light provided at boundaries of the adjacent first and second housings;

a gas supplier which supplies the interior of said first and second housings with a purging gas;

differential-pressure sensors which sense differences in pressure between adjacent said first and second housings; and a control unit which controls said gas supplier on the basis of outputs from said differential-pressure sensors in such a manner that pressures within the respective first and second housings will attain respective ones of predetermined pressures, wherein the network software provides said display with a user interface for accessing a maintenance database, which is connected to an external network of a plant at which said exposure apparatus has been installed, and which is provided by a vendor or user of the exposure apparatus, thereby making it possible to obtain information from said database via said external network.

* * * * *

UNITED STATES PATENT AND TRADEMARK OFFICE
CERTIFICATE OF CORRECTION

PATENT NO. : 6,864,953 B2
DATED : March 8, 2005
INVENTOR(S) : Shigeyuki Uzawa

It is certified that error appears in the above-identified patent and that said Letters Patent is hereby corrected as shown below:

Column 3,
After line 15, insert the following paragraph:
-- Furthermore, the exposure apparatus according to the present invention is provided with a display, a network interface and a computer for executing network software, whereby it is possible to transmit exposure-apparatus maintenance information by data communication via a computer network. --

Column 13,
Lines 5 and 10, both occurrences of "amount" should read -- an amount --.

Signed and Sealed this

Ninth Day of August, 2005

JON W. DUDAS
*Director of the United States Patent and Trademark Office*